United States Patent [19]

Eguchi

[11] Patent Number: 5,200,807
[45] Date of Patent: Apr. 6, 1993

[54] WIRING CONNECTION STRUCTURE FOR A SEMICONDUCTOR INTEGRATED CIRCUIT DEVICE

[75] Inventor: Koji Eguchi, Hyogo, Japan

[73] Assignee: Mitsubishi Denki Kabushiki Kaisha, Tokyo, Japan

[21] Appl. No.: 520,482

[22] Filed: May 8, 1990

[30] Foreign Application Priority Data

Oct. 30, 1989 [JP] Japan .................................. 1-283338

[51] Int. Cl.⁵ ...................... H01L 23/48; H01L 29/44; H01L 29/52; H01L 29/60
[52] U.S. Cl. ...................................... 257/758; 257/774
[58] Field of Search ......................... 357/55, 65, 71, 68

[56] References Cited

U.S. PATENT DOCUMENTS

| | | |
|---|---|---|
| 3,408,271 | 10/1968 | Reissmueller et al. ............... 357/68 |
| 3,436,611 | 4/1969 | Perry ..................................... 357/68 |
| 3,450,964 | 6/1969 | Meer et al. ............................ 357/68 |
| 3,465,214 | 9/1969 | Donald .................................. 357/68 |
| 3,518,506 | 6/1970 | Gates ..................................... 357/68 |
| 3,868,723 | 2/1975 | Lechaton et al. ...................... 357/68 |
| 3,902,188 | 8/1975 | Jacobson ............................... 357/68 |
| 4,306,246 | 12/1981 | Davies et al. .......................... 357/68 |
| 4,688,070 | 8/1987 | Shiotari et al. ....................... 357/68 |
| 4,694,320 | 9/1987 | Asano .................................... 357/68 |
| 4,734,754 | 3/1988 | Nikawa .................................. 357/68 |
| 4,737,838 | 4/1988 | Watanabe ............................... 357/65 |
| 4,866,502 | 9/1989 | Tomaszewski et al. .............. 357/68 |
| 4,907,039 | 3/1990 | Chikaki ................................. 357/68 |
| 4,908,690 | 6/1990 | Hata et al. ............................. 357/68 |
| 4,937,652 | 6/1990 | Okumura et al. ..................... 357/68 |
| 4,943,841 | 7/1990 | Yahara .................................. 357/68 |
| 4,961,104 | 10/1990 | Hirakawa ............................. 357/71 |

FOREIGN PATENT DOCUMENTS 58-39380 8/1983 Japan .
62-23460 5/1987 Japan .

Primary Examiner—Andrew J. James
Assistant Examiner—C. Whitehead, Jr.
Attorney, Agent, or Firm—Lowe, Price, LeBlanc & Becker

[57] ABSTRACT

A wiring connection structure for a semiconductor integrated circuit device interconnects a plurality of wiring layers isolated by an insulating layer, via a through hole defined in the insulating layer. The wiring connection structure comprises a semiconductor substrate, a first insulating layer, a first wiring layer, a second insulating layer and a second wiring layer. The first insulating layer is formed on a main surface of the semiconductor substrate. The first wiring layer is formed on the first insulating layer. The second insulating layer is formed on the first wiring layer. The through hole is formed in the second insulating layer so as to extend to a surface of the first wiring layer. The second wiring layer is formed on the second insulating layer and connected to the first wiring layer via the through hole. The through hole is a single through hole formed in a region where the second wiring layer overlaps with the first wiring layer. The through hole has a cross section comprising a figure formed by indenting peripheries of a single rectangular figure. This cross section has a longer perimeter than the single rectangular figure. Alternatively, the cross section comprises a figure formed by interconnecting band portions extending along the second wiring layer. A reduction is achieved in components of resistance over an entire through hole forming region. Concentration of current density on side walls of the through hole is also mitigated.

18 Claims, 7 Drawing Sheets

FIG.5
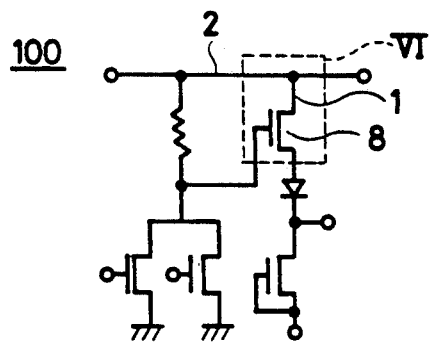
FIG.6A
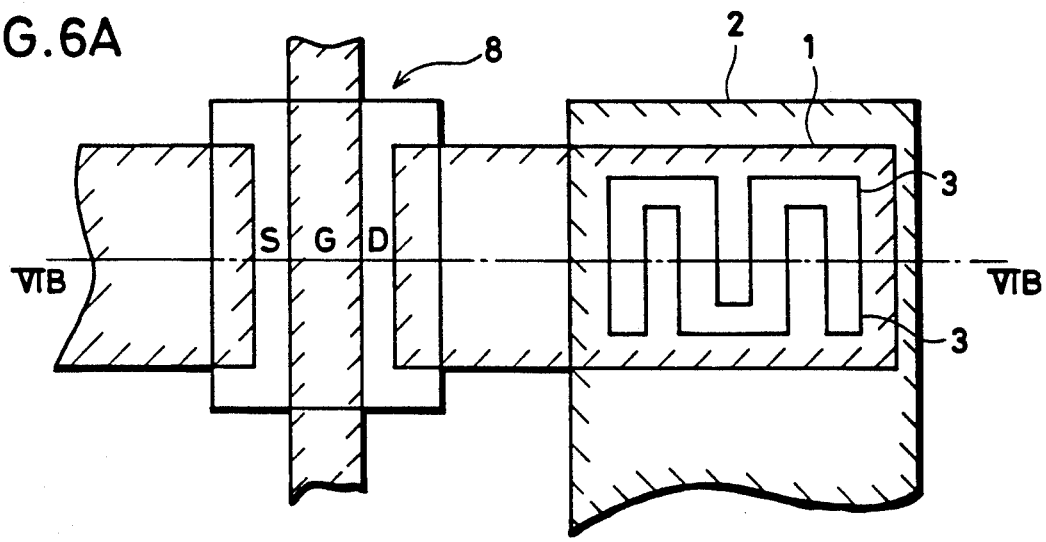
FIG.6B
FIG.7
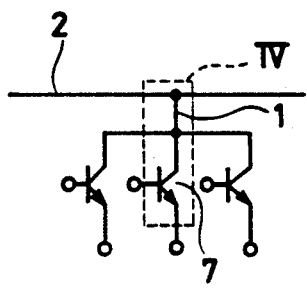
FIG.8
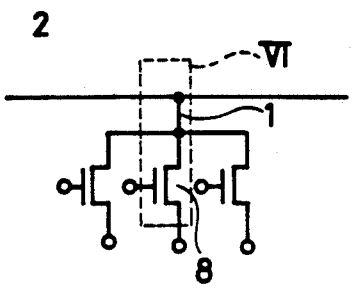

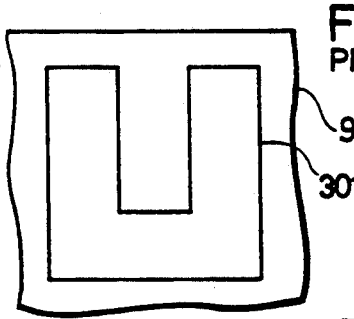
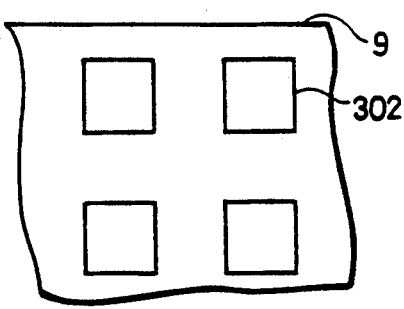
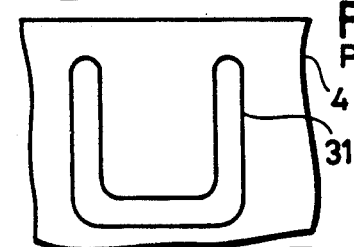
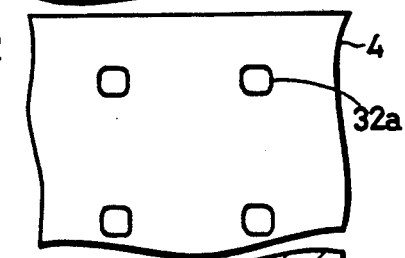
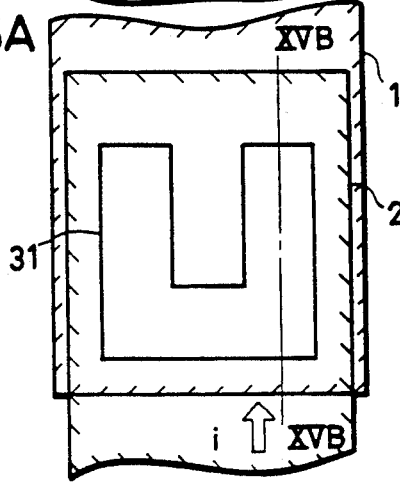
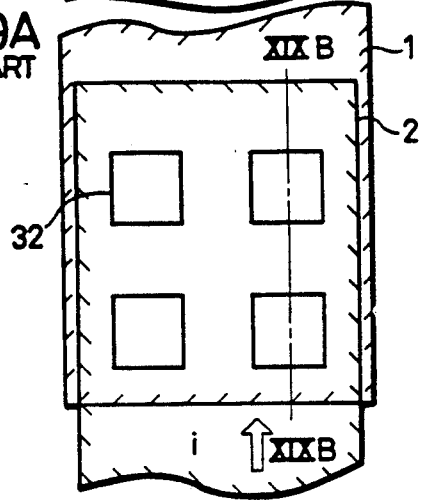
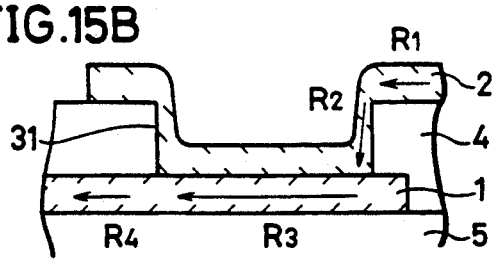
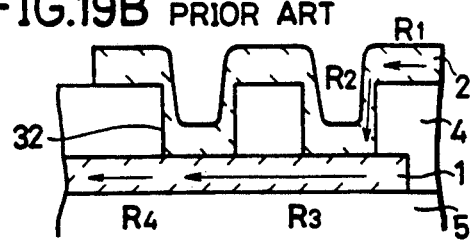
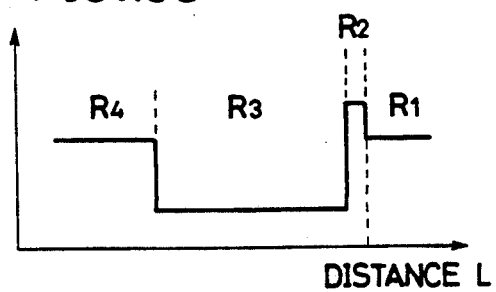
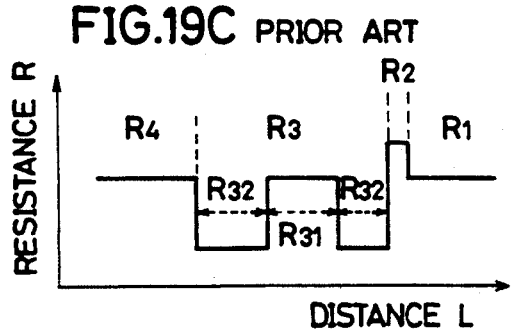

WIRING CONNECTION STRUCTURE FOR A SEMICONDUCTOR INTEGRATED CIRCUIT DEVICE

BACKGROUND OF THE INVENTION

1. Field of the Invention

This invention relates to wiring connection structures for semiconductor integrated circuit devices, and more particularly to a wiring connection structure included in a semiconductor integrated circuit device for interconnecting a plurality of wiring layers isolated by an insulating layer, via a through hole formed in the insulating layer.

2. Description of the Background Art

In the manufacture of semiconductor integrated circuit devices having a plurality of wiring layers, it is an essential technical requirement to electrically interconnect an upper wiring layer and a lower wiring layer via a through hole formed in an insulating layer. FIG. 16A is a fragmentary plan view showing a two-layer-wiring connection structure in a conventional semiconductor integrated circuit device. FIG. 16B is a vertical section taken on line XVIB—XVIB of FIG. 16A. FIG. 16C is a cross section taken on line XVIC—XVIC of FIG. 16B and showing a second wiring layer. The conventional two-layer-wiring connection structure will be described hereunder with reference to these drawings.

As illustrated, a first wiring layer 1, e.g. an aluminum wiring layer, is formed on an insulating base layer 5 acting as a substrate. A second wiring layer 2, e.g. an aluminum wiring layer, is formed as insulated and separated from the first wiring layer 1 by an interlayer insulating film 4, e.g. a film of silicon oxide. The interlayer insulating film 4 defines a through hole 33 in a region of the second wiring layer 2 overlapping with the first wiring layer 1. Via this through hole 33 the first wiring layer 1 are electrically interconnected with the second wiring layer 2 in the region where the two layers intersect. The through hole 33 has a rectangular cross section.

In order to secure a large current capacity of the wiring layers having fixed thicknesses, it has been a common practice to form the wiring layers with an extended width. Thus, it is also necessary for the through hole formed for electrical connection between the first and second wiring layers to have the largest possible opening area, in order to minimize the components of resistance of the through hole. For this purpose, the conventional wiring connection structure, as shown in FIG. 16A, includes a through hole having a maximum opening area in the region of intersection between the first and second wiring layers for allowing a connection therebetween.

As, as shown in FIG. 16C, however, the second wiring layer 2 has a reduced thickness where it extends along side walls of the through hole 33. Assuming that the first wiring layer 1 and second wiring layer 2 include flat portions having a thickness t1, the portions of the second wiring layer 2 on the side walls of the through hole 33 have a thickness t2 which is on the order of 10 to 30% of the thickness t1. The portion of the second wiring layer 2 formed in a bottom region of the through hole 33 has a thickness t3 on the order of 50 to 70% of the thickness t1. The interlayer insulating film 4 interposed between the first wiring layer 1 and second wiring layer 2 has a thickness t4 which is about twice the thickness t1. To quote one example of the layer thicknesses, t1 is on the order of 5000 to 10000Å.

As noted above, the thickness t2 of the second wiring layer 2 formed on the side walls of the through hole 33 is smaller than the thickness t3 of the flat portions of the first wiring layer 1 and second wiring layer 2 and the thickness t3 of the second wiring layer 2 in the bottom region of the through hole 33. This means the presence of a reduced sectional area in the passage of a current flowing from the second wiring layer 2 to the first wiring layer 1. That is, when a current flows between the first wiring layer 1 and second wiring layer 2 via through hole 33, the current will concentrate in the positions formed along the side walls of the through hole 33. A high density current, e.g. a current having a density of $1 \times 10^5 A/cm^2$ or more, flowing through a wiring layer tends to cause electromigration. Electromigration is a phenomenon of movement of metallic atoms occurring when a dense flow of electrons collides with the metallic atoms of a wiring layer whereby the electrons become scattered. As a result of electromigration, defects called voids are produced in the wiring layer along grain boundaries. These voids will grow gradually, and the current density will increase with the decrease in the sectional area of the wiring layer, thereby heating and breaking the wiring layer.

Generally, the following measures are considered feasible for improving resistance to the electromigration occurring in the through hole:

(1) Change the material of the wiring layer for one highly resistive to electromigration.

(2) Form a through hole with side walls including tapered portions to increase the thickness of the wiring layer on the side walls.

(3) Disperse the current flowing along the side walls of the through hole by increasing the perimeter around the opening of the through hole. That is, mitigate the concentration of the current density on the side wall of the through hole.

(4) Fill up the through hole to be level with the wiring layer.

Japanese Patent Publications Nos. 58-39380 and 62-23460 disclose wiring connection structures having through holes improved with the measure (3) above. FIG. 17 is a fragmentary plan view showing a wiring connection structure having the through holes disclosed in these publications. According to the wiring connection structure having the improved through holes, the second wiring layer 2 is electrically connected to the first wiring layer 1 via through holes which are standardized into a plurality of small units. That is, in this drawing, the first wiring layer 1 and second wiring layer 2 are electrically interconnected via two through holes 34.

In the improved wiring connection structure, the wiring layers are interconnected via a plurality of through holes having a small opening area. The plurality of through holes have a total perimeter around their openings longer than the perimeter around the opening of a single through hole in the same through-hole forming region. The concentration of the current density on the side walls of the through holes is mitigated where the wiring layers are interconnected via a plurality of through holes, compared with the case where the wiring layers are interconnected via a single through hole. Consequently, a reduced resistance of the wiring layer occurs around the through holes.

Forming a plurality of through holes, however, is not necessarily of advantage in increasing the perimeter around the opening of the through hole. FIG. 18A shows a mask used in forming a plurality of through holes, e.g. four through holes. FIG. 18B is a fragmentary plan view showing an example of finished patterns of the four through holes formed by using the mask shown in FIG. 18A. A resist 9 used as the mask defines a plurality of through hole patterns 302 formed as perforations for providing predetermined perimeters. This mask is used to form a plurality of through holes in an interlayer insulating film 4. If the interlayer insulating film 4 is etched under non-uniform conditions or etched in an insufficient amount, the resulting through holes 32a, as shown in FIG. 18B, have markedly reduced opening areas with respect to the through hole patterns 302. Thus, even if through hole patterns 302 are formed in the mask stage to have long perimeters, the finished patterns of through holes actually formed in the interlayer insulating film 4 have far shorter perimeters than the through hole patterns 302.

Where the through holes are standardized into a plurality of small units, not only is the resistance of the through holes reduced for the increase in the perimeter, but portions are formed that contribute toward an increase in the resistance of the through holes. FIG. 19A is a fragmentary plan view showing a wiring connection structure having, for example, four standardized through holes. FIG. 19B is a fragmentary sectional view taken on line XIXB—XIXB of FIG. 19A. FIG. 19C is a graph showing variations in the resistance occurring along the section of the wiring layer shown in FIG. 19B. It is assumed here that a current flows from the second wiring layer 2 to the first wiring layer 1 via through holes 32 in the direction of arrow i. Components of resistance of the through holes are conceptually grasped as follows, which occur in the course of current flow from the second wiring layer 2 to the first wiring layer 1.

R1: A component of resistance occurring from the second wiring layer 2 to an end of each through hole (i.e. a component of resistance due to the shape of the through holes).

R2: A component of resistance occurring along a side wall of each through hole (i.e. a component of resistance due to the perimeters around the openings of the through holes).

R3: A component of resistance occurring when the current flows through the first wiring layer 1 in the through hole forming region.

R4: A component of resistance occurring when the current flows through the first wiring layer 1 outside the through hole forming region.

It is assumed that, as shown in FIG. 19B, the current flows from the second wiring layer 2 to the first wiring layer 1 via the through holes 32 along the course indicated by the arrows marked with the respective components of resistance. The component of resistance R2 occurring when the current flows along the side walls of the through holes 32 is high as shown in FIG. 19C. This resistance component R2 of all the four through holes 32 taken as a whole is reduced for the increase in the total perimeter of the through holes 32. However, the current having passed through the side wall portion of each through hole 32 flows to the first wiring layer 1 in the bottom portion thereof. At this time, the current flows also to portions of the first wiring layer 1 out of electrical contact with the second wiring layer 2 since there are a plurality of through holes 32. In regions where the first wiring layer 1 and second wiring layer 2 are in electrical contact, the sectional area of the passage of the current is a sum of sectional areas of the first wiring layer 1 and second wiring layer 2. Therefore, as shown in FIG. 19C, the regions of electrical contact between the first wiring layer 1 and second wiring layer 2 have a low resistance component R32. On the other hand, the regions where the current flows only through the first wiring layer 1 in bottom portions of the through hole forming region have a high resistance component R31. In some cases, the resistance component R3 increases despite the reduced resistance component R2 of the all through holes taken as a whole. Thus, even if a plurality of through holes are formed in order to increase the perimeter around the opening of the through hole, there is the problem that this does not necessarily contribute toward a reduction in the resistance occurring in or adjacent the through hole.

SUMMARY OF THE INVENTION

An object of this invention to reduce components of resistance of an entire through hole forming region in a wiring connection structure.

Another object of this invention to mitigate concentration of current density on side walls of a through hole in a wiring connection structure.

A further object of this invention to increase the perimeter and cross-sectional area of the opening of a through hole in a wiring connection structure regardless of etching conditions at a time of through hole formation.

Yet another object of this invention to provide a wiring connection structure applicable to a power supply region having a large current capacity.

A still further object of this invention to provide a wiring connection structure for supplying power to a bipolar transistor.

A still further object of this invention to provide a wiring connection structure for supplying power to a field effect transistor.

Broadly, the invention is an interconnection for a semiconductor integrated circuit device, wherein the interconnection comprises a first wiring layer, an insulating layer and a second wiring layer. The insulating layer includes a through hole extending to a surface of the first wiring layer. The second wiring layer is connected to the first wiring layer via the through hole. Specifically, the through hole comprises only one through hole and the one through hole has a continuous convoluted cross-sectional shape.

A wiring connection structure for a semiconductor integrated circuit device according to this invention is intended for interconnecting a plurality of wiring layers isolated by an insulating layer, via a through hole defined in the insulating layer. The wiring connection structure comprises a semiconductor substrate, a first insulating layer, a first wiring layer, a second insulating layer and a second wiring layer. The semiconductor substrate has a main surface. The first insulating layer is formed on the main surface of the semiconductor substrate. The first wiring layer is formed on the first insulating layer. The second insulating layer is formed on the first wiring layer. A through hole is formed in the second insulating layer so as to extend to a surface of the first wiring layer. The second wiring layer is formed on the second insulating layer and connected to the first wiring layer via the through hole. The through hole is a single through hole formed in a region where the second wiring layer overlaps with the first wiring layer. The through hole has a cross section, for example when viewed from above, comprising a figure formed by indenting peripheries of a single rectangular figure. This cross section has a longer perimeter than the single rectangular figure.

In this invention, the cross section of the through hole has a longer perimeter than a single rectangle formed in the region where the second wiring layer overlaps with the first wiring layer. Consequently, a reduction is achieved in the component of resistance on side walls of the through hole.

Further, in this invention, a single through hole is formed in the region of the second wiring layer overlapping with the first wiring layer, which through hole defines an opening having a larger cross-sectional area than a plurality of through holes having a total perimeter corresponding to that of the single through hole. The through hole is a bore having a single, continuous side and bottom wall in the through hole forming area. Thus, the sectional area of the passage through which a current flows in the bottom region of the through hole is always a sum of sectional areas of the first and second wiring layers. Therefore, after having flowed from the second wiring layer to the first wiring layer via the through hole, the current is allowed to flow continuously through the portion having a large cross-sectional area, namely the bottom region of the through hole having a reduced component of resistance. The resistance component will never increase in the bottom region of the through hole. The single through hole having a long perimeter is effective not only to mitigate concentration of current density on side walls of the through hole but to reduce the resistance components in the entire through hole forming region.

Moreover, since a single through hole is formed according to this invention, the perimeter and cross-sectional area of the opening of the through hole are maintained without a marked reduction, in contrast with the case of forming a plurality of through holes, even when a finished pattern of the through hole is diminished owing to non-uniformity of etching conditions or other factors. Thus, the resistance components of the through hole may be reduced regardless of the etching conditions at a time of through hole formation.

In a preferred embodiment of this invention, the through hole has a shape of a winding groove. Specifically, the through hole may have a U-shaped cross section, a cross section with a shape of three parallel grooves and one groove extending between intermediate positions of the two outer grooves, a gammadion-shaped cross section, or a cross section winding at right angles. The second wiring layer may provide wiring line for connection to a power supply circuit.

BRIEF DESCRIPTION OF THE DRAWINGS

FIG. 5 is a circuit diagram showing another example of wiring region 100 in FIG. 2, FIG. 6A is a fragmentary plan view showing an arrangement of the portion enclosed in block VI of FIG. 5, FIG. 6B is a fragmentary sectional view taken on line VIB—VIB of FIG. 6A, FIGS. 7 and 8 are circuit diagrams showing different examples of regions to which the wiring connection structure according to this invention is applied, respectively, FIG. 14A is a fragmentary plan view showing a mask used in forming a through hole according to this invention, FIG. 14B is a fragmentary plan view showing a finished pattern of the through hole formed by using the mask shown in FIG. 14A, FIG. 15A is a fragmentary plan view showing a wiring connection structure having a through hole according to this invention, FIG. 15B is a fragmentary sectional view taken on line XVB—XVB of FIG. 15A, FIG. 15C is a graph showing variations in components of resistance occurring along the section shown in FIG. 15B.

FIG. 18A is a fragmentary plan view showing a mask used in forming through holes in the prior art, FIG. 18B is a fragmentary plan view showing an example of finished patterns of the through holes formed by using the mask shown in FIG. 18A.

FIG. 19A is a fragmentary plan view showing a wiring connection structure having through holes according to the prior art, FIG. 19B is a fragmentary sectional view taken on line XIXB—XIXB of FIG. 19A, and FIG. 19C is a graph showing variations in components of resistance occurring along the section shown in FIG. 19B.

DESCRIPTION OF THE PREFERRED EMBODIMENTS

Figure 1A:
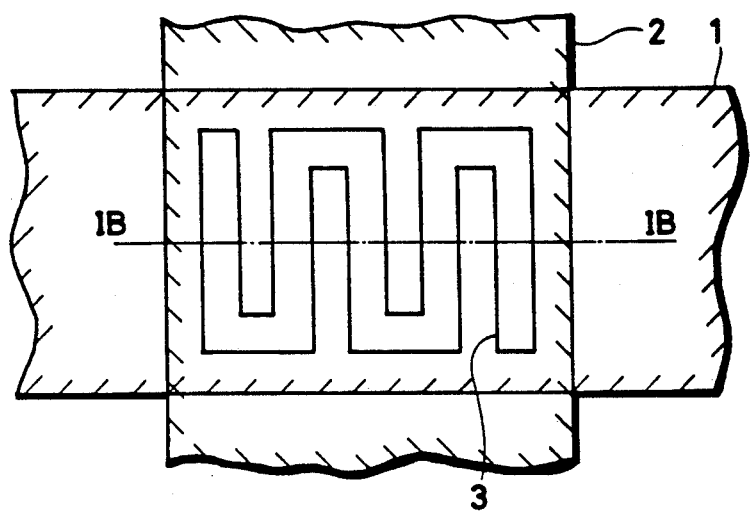
FIG. 1A is a fragmentary plan view showing a wiring connection structure according to one embodiment of this invention.
Figure 1B:
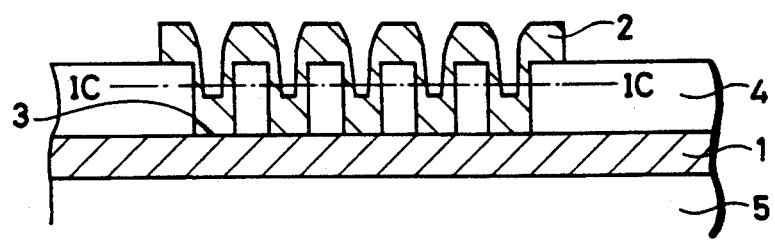
FIG. 1B is a vertical section taken on line IB—IB of FIG. 1A.
Figure 1C:
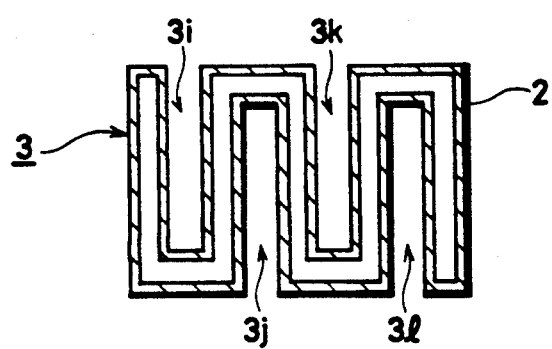
FIG. 1C is a cross section taken on line IC—IC of FIG. 1B.

An embodiment of this invention will be described with reference to FIGS. 1A through 1C.

A first wiring layer 1 comprising a silicide of a metal having a high melting point, such as aluminum, an aluminum-silicon alloy or tungsten, is formed on an insulating base layer 5 acting as a substrate. A second wiring layer 2 is formed on the first wiring layer 1 as insulated and isolated therefrom by an interlayer insulating film 4, e.g. a film of silicon oxide. The second wiring layer 2 is electrically connected to the first wiring layer 1 via a through hole 3 in a region where the two layers 1 and 2 intersect in vertical overlap. The intersecting region of the first wiring layer 1 and second wiring layer 2 has a rectangular shape with sides about 10-odd micrometers long, for example. The second wiring layer 2 has a reduced thickness along side walls of the through hole 3. As shown in FIG. 1C, the total length of the side walls of the through hole 3, that is the perimeter around the opening of the through hole 3, is greater than the perimeter of a single rectangle. The through hole 3 has the shape of a winding groove. In other words, as shown in FIG. 1C, the through hole 3 has a cross-sectional formed by indenting outer peripheries of a rectangular figure in four directions 3i, 3j, 3k and 3l. Consequently, the through hole 3 is formed to have a longer perimeter than the original rectangle. The extended perimeter of the through hole mitigates concentration of a current flowing through the second wiring layer 2 formed on the side walls of the through hole 3.

Figure 2:
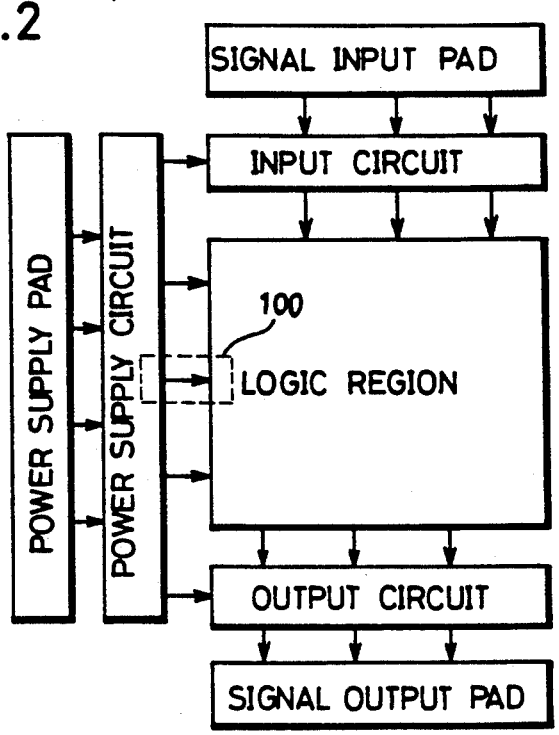
FIG. 2 is a block diagram schematically showing a semiconductor integrated circuit device to which the wiring connection structure according to this invention is applied.

Referring to FIG. 2, a predetermined signal is transmitted to an input circuit through a signal input pad. The signal transmitted to the input circuit is processed in a logic region and transmitted to an output circuit. The processed signal is output from a signal output pad. At this time, power is supplied to the input circuit, logic region, and output circuit. The power is input through a power supply pad, and is then supplied from a power supply circuit to the respective regions. The wiring connection structure according to this invention is applicable, for example, to a wiring region 100 through which the power is supplied from the power supply circuit to the logic region.

Figure 3:
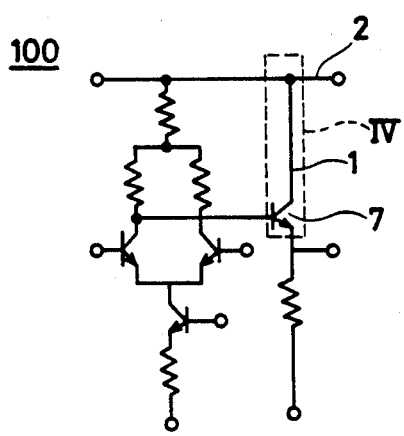
FIG. 3 is a circuit diagram showing an example of wiring region 100 in FIG. 2.
Figure 4A:
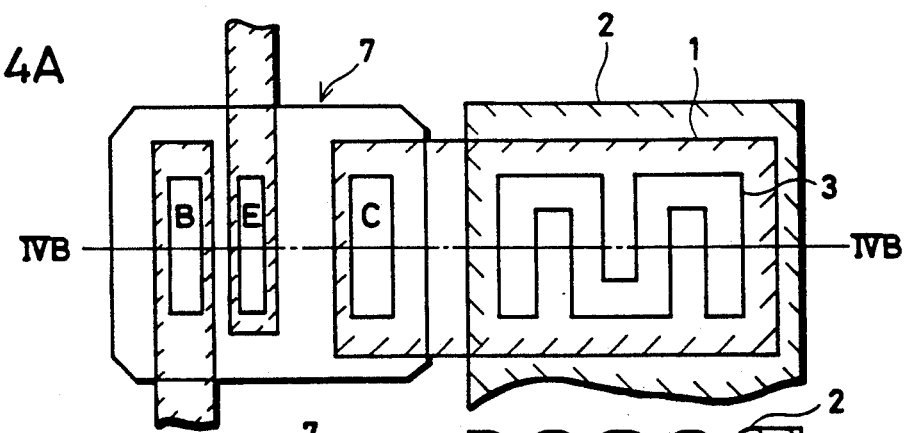
FIG. 4A is a fragmentary plan view showing an arrangement of the portion enclosed in block IV of FIG. 3.
Figure 4B:
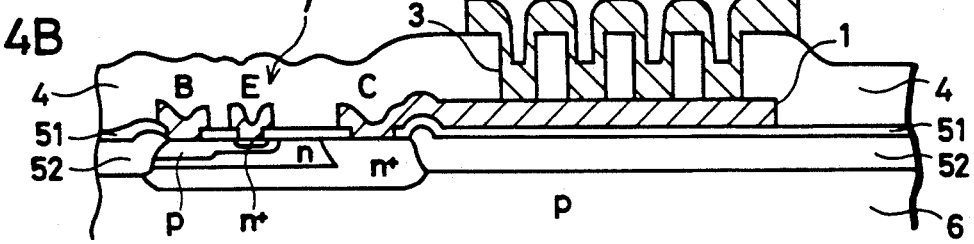
FIG. 4B is a fragmentary sectional view taken on line IVB—IVB of FIG. 4A.

Referring to FIGS. 3, 4A and 4B, the second wiring layer 2 acting as a source line is electrically connected via the through hole 3 to the first wiring layer 1 connected to a collector region of a bipolar transistor 7. The bipolar transistor 7 is formed in a region on a p-type silicon substrate 6 separated by an element-separating silicon oxide film 52. The bipolar transistor 7 has a base electrode B, an emitter electrode E and a collector electrode C. The collector electrode C is connected to the first wiring layer 1. The first wiring layer 1 is formed on a silicon oxide film 51.

Referring to FIGS. 5, 6A and 6B, the second wiring layer 2 acting as a source line is electrically connected to the first wiring layer 1 via the through hole 3. The first wiring layer 1 is connected to a drain electrode of a field effect transistor 8. The field effect transistor 8 is formed in a region on a p-type silicon substrate 6 separated 8 by an element-separating silicon oxide film 52. The field effect transistor 8 has a gate electrode G, a source electrode S and the drain electrode D.

FIG. 7 shows another example of basic circuits comprising a bipolar transistor, to which the wiring structure of this invention is applicable. The planar and sectional construction of the portion marked IV in FIG. 7 corresponds to the construction shown in FIGS. 4A and 4B. FIG. 8 is a view showing another example of basic circuits comprising a field effect transistor, to which the wiring structure of this invention is applicable. The construction of the portion marked VI in FIG. 8 corresponds to the construction shown in FIGS. 6A and 6B.

Figure 9:
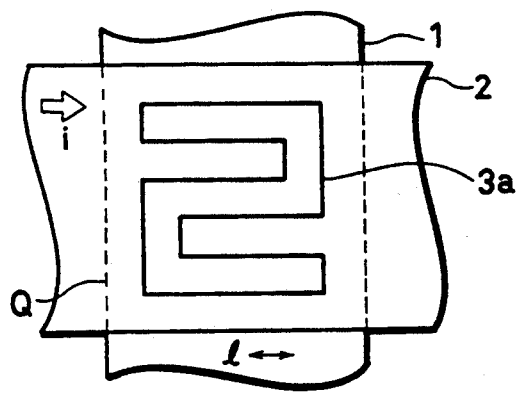
FIGS. 9, 10 and 11 are fragmentary plan views showing wiring connection structures having through holes according to other embodiments of this invention.
Figure 10:
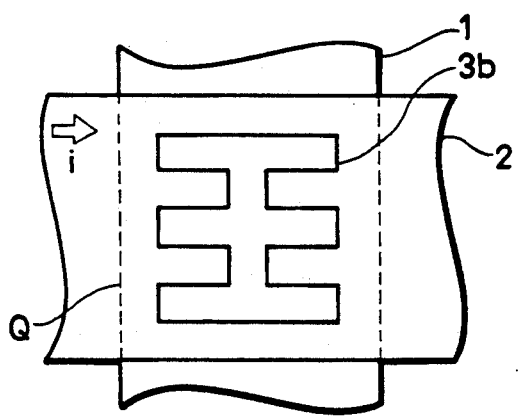
Figure 11:
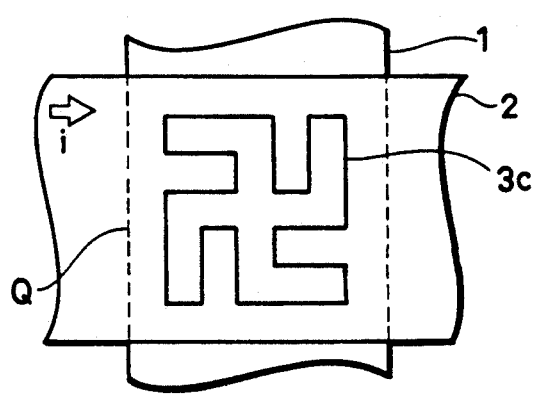
Figure 12:
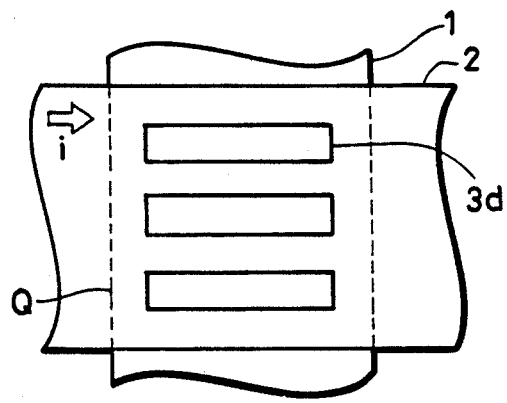
FIGS. 12 and 13 are fragmentary plan views showing comparative examples of wiring connection structures having through holes according to the prior art.
Figure 13:
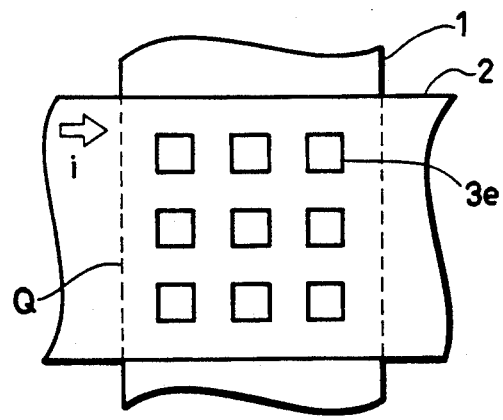
Figure 16A:
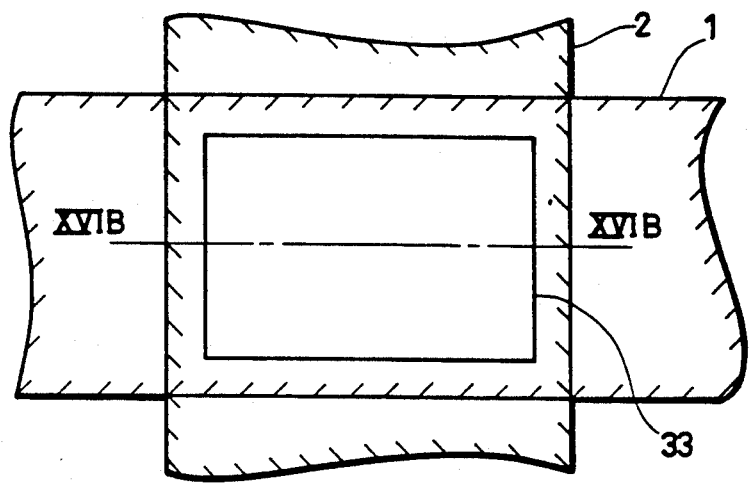
FIG. 16A is a fragmentary plan view showing a conventional wiring connection structure having a through hole.
Figure 16B:
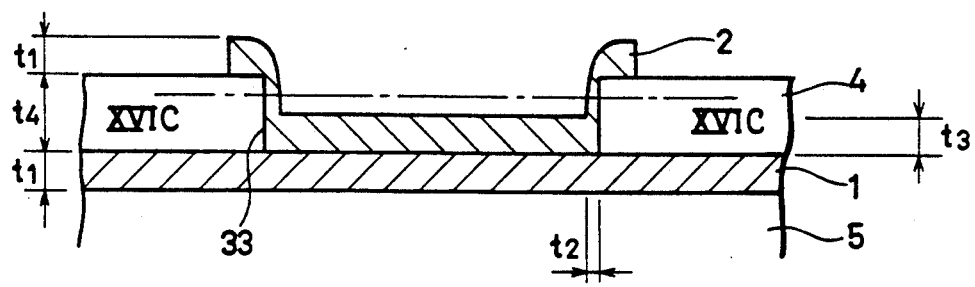
FIG. 16B is a vertical section taken on line XVIB—XVIB of FIG. 16A.
Figure 16C:
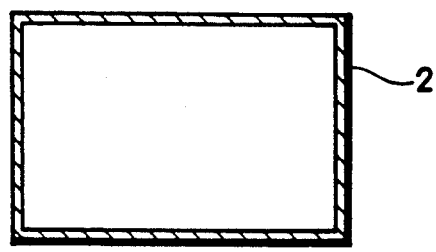
FIG. 16C is a cross section taken on line XVIC—XVIC of FIG. 16B.
Figure 17:
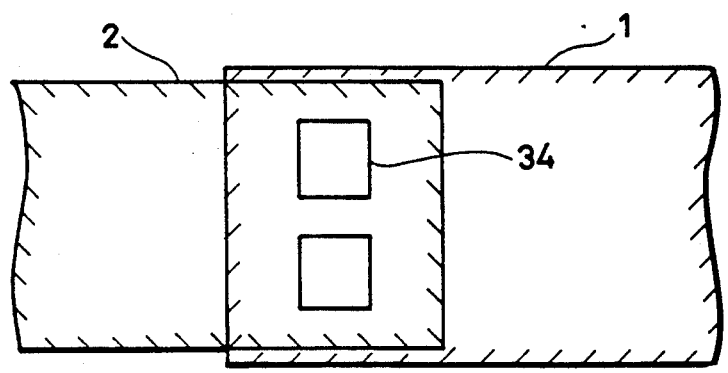
FIG. 17 is a fragmentary plan view showing a wiring connection structure having through holes according to the prior art.

Referring to FIGS. 9 through 11, the second wiring layer 2 is electrically connected to the first wiring layer 1 via respective through holes 3a, 3b and 3c. Assuming a unit length 1 in FIG. 9, each of the through holes 3a, 3b and 3c shown in FIGS. 9 through 11 has a perimeter 36l around the opening. FIGS. 12 and 13 show, as comparative examples, wiring connection structures each including through holes 3d or 3e standardized into a plurality of small units having a total perimeter around the openings equal to the perimeter 36l. The opening of each through hole 3a, 3b or 3c has a cross-sectional area $17l^2$, whereas the opening of the through hole 3d in one of the comparative examples has a cross-sectional area $15l^2$ and that of the through hole 3e a cross-sectional area $9l^2$.

It is assumed here that a current flows from the second wiring layer 2 to the first wiring layer 1 via each through hole in the direction of arrow i in each of these drawings. Calculation is made of the resistance R1 occurring from a reference line Q shown in each drawing to an end of each through hole, i.e. up to a side wall or walls of each through hole (or a component of resistance due to the shape of each through hole). The wiring layer is assumed to have a resistance r per square of a unit side length 1 (having an area $l^2$). The following are the values of resistance component R1 derived in a simple manner by regarding the distances from the reference line Q to all the relevant side walls of the through holes as equivalent.

| Through Holes | Resistance Values of R1 |
| --- | --- |
| 3a | 1/17.4r |
| 3b | 1/17.8r |
| 3c | 1/16.7r |
| 3d | 1/17.5r |
| 3e | 1/06.5r |

According to the results of the calculation, the resistance component R1 of the through holes 3a, 3b and 3c in this invention exhibits values of resistance not exceeding those of the comparative through holes 3d and 3e. That is, the resistance component R1 due to the shape of the through hole does not increase whether, in order to form through holes having an equal perimeter, the through hole is divided into a plurality of standardized small units as in the prior art or a single through hole is formed as in this invention.

Referring to FIG. 14A, a through hole pattern 301 is formed in a resist 9 in the mask stage, which is equal in the perimeter around the opening to the conventional through hole patterns 302 shown in FIG. 18A. This mask is used to form a through hole in an interlayer insulating film 4. A through hole 31a as shown in FIG. 14B will be formed if the interlayer insulating film 4 is etched under non-uniform conditions or etched in an insufficient amount. This finished through hole 31a has a perimeter around the opening which is not much shorter than the perimeter of the through hole pattern 301 in the mask stage. This will be clearly understood by comparing the perimeter of the through hole 31a shown in FIG. 14B with the total perimeter of the conventional through holes 32a shown in FIG. 18B. Furthermore, even if the etching conditions lack uniformity, the cross-sectional area of the opening of the through hole 31a formed according to this invention is not reduced from that of the through hole pattern 301 in the mask stage to such a marked extent as depicted in FIGS. 18A and 18B.

It is assumed here that a current i flows from the second wiring layer 2 to the first wiring layer 1 via the through hole 31 in the direction of an arrow in FIG. 15A. The manner in which the current flows is shown in FIG. 15B. Components of the resistance R1, R2, R3 and R4 of the through hole 31 have varied values of resistance as shown in FIG. 15C.

The perimeter around the opening of the through hole 31 of this invention shown in FIG. 15A is equal in length to the total perimeter of the conventional through holes 32 shown in FIG. 19A. Consequently, with the through holes 31 and 32, the resistance component R1 due to the shape of the through holes and the resistance component R2 due to the perimeter of the through holes are understood to have substantially the same resistance values throughout the through hole(s). However, with the single through hole 31 of this invention, the bottom region of the through hole provides a resistance component R3 having a substantially uniform low resistance value. Since the through hole of this invention comprises a single through hole with a continuous side and bottom wall, the sectional area of the passage through which a current flows in the bottom potion of the through hole is always a sum of sectional areas of the first wiring layer 1 and second wiring layer 2. That is, the first and second wiring layers 1 and 2 are in electrical contact over entire surfaces thereof in the bottom portion of the through hole forming region. Therefore, as shown in FIG. 15C, the resistance component R3 will never increase in the bottom portion of the through hole. As a result, a single through hole is provided which is effective to reduce the resistance components of the entire through hole forming region.

In other words, the cross section of the through hole according to this invention, as shown in FIG. 15A, comprises a figure formed by interconnecting band-like portions extending along the second wiring layer, for example. Consequently, this cross section has a long perimeter and a continuous side and bottom wall.

As described, this invention provides a wiring connection structure including a single through hole having a long perimeter around its opening, and is therefore capable of mitigating concentration of the current density on the side walls of the through hole. Further, the passage of a current in the bottom portion of the through hole forming area has a constant cross-sectional area without any reduction. Thus, there can be no region in the bottom of the through hole where the resistance component increases. As a result, the resistance component may be reduced over the entire through hole forming region where the first and second wiring layers are electrically interconnected. Moreover, the through hole may have an increased perimeter and cross-sectional area regardless of etching conditions at a time of through hole formation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wiring connection structure for a semiconductor integrated circuit device for interconnecting a plurality of wiring layers isolated by an insulating layer, via a through hole defined in the insulating layer, comprising:
   a semiconductor substrate having a main surface,
   a first insulating layer formed on the main surface of said semiconductor substrate;
   a first wiring layer formed on said first insulating layer;
   a second insulating layer formed on said first wiring layer and including a through hole defined so as to extend to a surface of said first wiring layer; and
   a second wiring layer formed on said second insulating layer and connected to said first wiring layer via said through hole,
   wherein said through hole comprises a single through hole in a region where said second wiring layer overlaps with said first wiring layer, said through hole forming a winding groove having a continuous perimeter.

2. A wiring connection structure for a semiconductor integrated circuit device for interconnecting a plurality of wiring layers isolated by an insulating layer, via a through hole defined in the insulating layer, comprising:
   a semiconductor substrate having a main surface;
   a first insulating layer formed on the main surface of said semiconductor substrate;
   a first wiring layer formed on said first insulating layer;
   a second insulating layer formed on said first wiring layer and including a through hole defined so as to extend to a surface of said first wiring layer; and
   a second wiring layer which provides a wiring line for connection to a power supply circuit, said second wiring layer being formed on said second insulating layer and connected to said first wiring layer via said through hole,
   wherein said through hole comprises only one through hole in a region where said second wiring layer overlaps with said first wiring layer, said one through hole having a continuous convoluted shape.

3. A wiring connection structure according to claim 2 wherein said through hole comprises three parallel grooves and one groove intersecting intermediate positions of the parallel grooves.

4. A wiring connecting structure for a semiconductor integrated circuit device for interconnecting a plurality of wiring layers isolated by an insulating layer, via a through hole defined in the insulating layer, comprising:
   a semiconductor substrate having a main surface;
   a first insulating layer formed on the main surface of said semiconductor substrate;
   a first wiring layer formed on said first insulating layer;
   a second insulating layer formed on said first wiring layer and including a through hole defined so as to extend to a surface of said first wiring layer; and
   a second wiring layer formed on said second insulating layer and connected to said first wiring layer via said through hole,
   wherein said through hole comprises a single through hole in a region where said second wiring layer overlaps with said first wiring layer, said through hole forming a gammadion shaped groove having a continuous perimeter.

5. A wiring connection structure according to claim 1 wherein turns of said winding groove form right angles.

6. A wiring connection structure according to claim 2 wherein said through hole forms a U-shaped groove.

7. A wiring connection structure according to claim 2 wherein said first wiring layer provides a wiring line for connection to a logic region.

8. A wiring connection structure according to claim 7 wherein said logic region includes a bipolar transistor.

9. A wiring connection structure according to claim 8 wherein said first wiring layer provides a wiring line for connection to a collector region of said bipolar transistor.

10. A wiring connection structure according to claim 7 wherein said logic region includes a field effect transistor.

11. A wiring connection structure according to claim 10 wherein said first wiring layer provides a wiring line for connection to a drain region of said field effect transistor.

12. A wiring connection structure for a semiconductor integrated circuit device for interconnecting a plurality of wiring layers isolated by an insulating layer, via a through hole defined in the insulating layer, comprising:
  a semiconductor substrate having a main surface;
  a first wiring layer formed on the main surface of said semiconductor substrate;
  a second insulating layer formed on said first wiring layer and including a through hole having sidewalls, said through hole extending through said second insulating layer to expose a portion of a surface of said first wiring layer; and
  a second wiring layer formed on said second insulating layer and extending into said through hole to cover the sidewalls of said through hole and the exposed portion of the surface of said first wiring layer such that said second wiring layer connects to said first wiring layer via said through hole, said second wiring layer only partially filling said through hole;
  wherein said through hole comprises a single through hole in a region where said second wiring layer overlaps with said first wiring layer, said sidewalls of said through hole form a continuous perimeter, and said single through hole has a continuous convoluted shape in a cross-section parallel to the main surface of said semiconductor substrate.

13. A wiring connection structure as in claim 12 further comprising an insulating layer interposed between the main surface of the semiconductor substrate and the first wiring layer in a region beneath said through hole.

14. A wiring connection structure as in claim 12 wherein said through hole comprises a U-shaped cross-sectional groove.

15. A wiring connection structure as in claim 12, wherein said through hole comprises at least two parallel grooves and one groove intersecting intermediate positions of the parallel grooves.

16. A wiring connection structure according to claim 1, wherein:
  (i) said through hole has sidewalls, said through hole extends through said second insulating layer to expose a portion of a surface of said first wiring layer,
  (ii) said second wiring layer covers the sidewalls of said through hole and the exposed portion of the surface of said first wiring layer, and
  (iii) said second wiring layer only partially fills said through hole.

17. A wiring connection structure according to claim 4, wherein:
  (i) said through hole has sidewalls, said through hole extends through said second insulating layer to expose a portion of a surface of said first wiring layer,
  (ii) said second wiring layer covers the sidewalls of said through hole and the exposed portion of the surface of said first wiring layer, and
  (iii) said second wiring layer only partially fills said through hole.

18. A wiring connection structure according to claim 2, wherein:
  (i) said through hole has sidewalls, said through hole extends through said second insulating layer to expose a portion of a surface of said first wiring layer,
  (ii) said second wiring layer covers the sidewalls of said through hole and the exposed portion of the surface of said first wiring layer, and
  (iii) said second wiring layer only partially fills said through hole.

* * * * *